United States Patent
Yamaguchi

[11] Patent Number: 5,811,321
[45] Date of Patent: Sep. 22, 1998

[54] SEMICONDUCTOR PRESSURE DETECTING DEVICE AND MANUFACTURING METHOD OF THE DEVICE

[75] Inventor: Yasuo Yamaguchi, Itami, Japan

[73] Assignee: Mitsubishi Denki Kabushiki Kaisha, Tokyo, Japan

[21] Appl. No.: 919,312

[22] Filed: Aug. 28, 1997

Related U.S. Application Data

[62] Division of Ser. No. 543,439, Oct. 19, 1995, Pat. No. 5,703,393.

[30] Foreign Application Priority Data

Jun. 27, 1995 [JP] Japan .................................... 7-160435

[51] Int. Cl.⁶ .................................................. H01L 21/00
[52] U.S. Cl. .............................................. 438/51; 438/53
[58] Field of Search ................................ 438/50, 51, 52, 438/53

[56] References Cited

U.S. PATENT DOCUMENTS

| | | |
|---|---|---|
| 4,291,293 | 9/1981 | Yamada et al. . |
| 4,843,454 | 6/1989 | Kato et al. . |
| 5,002,901 | 3/1991 | Kurtz et al. ................................ 438/51 |
| 5,200,363 | 4/1993 | Schmidt .................................... 438/53 |
| 5,266,827 | 11/1993 | Kato . |
| 5,424,249 | 6/1995 | Ishibashi ................................... 438/51 |
| 5,455,203 | 10/1995 | Koseki et al. ............................. 438/53 |
| 5,459,351 | 10/1995 | Bender . |
| 5,585,311 | 12/1996 | Ko ............................................ 438/51 |

FOREIGN PATENT DOCUMENTS

| | | |
|---|---|---|
| 80153180 | 8/1985 | Japan . |
| 2296373 | 12/1990 | Japan . |

Primary Examiner—Kevin Picardat

[57] ABSTRACT

A semiconductor pressure detecting device in which a pressure sensing element (2) made of semiconductor having a diaphragm portion (9), a pedestal (8) for supporting the pressure sensing element (2) and wires (5) connected to the pressure sensing element (2) are molded by a molding resin (6) not so as to mold the diaphragm portion (9), characterized in that a silicon resin layer (4) is adhered on an outer surface of the diaphragm portion (9).

11 Claims, 6 Drawing Sheets

SEMICONDUCTOR PRESSURE DETECTING DEVICE AND MANUFACTURING METHOD OF THE DEVICE

This application is a divisional of application Ser. No. 08/543,439 filed on Oct. 16, 1995, now U.S. Pat. No. 5,703,393, the entire contents of which are hereby incorporated by reference.

FIELD OF THE INVENTION

The present invention relates to a semiconductor pressure detecting device in which a pressure sensing element is molded by a molding resin and to a manufacturing method of the device.

DESCRIPTION OF THE PRIOR ART

Conventionally, there is known a semiconductor device for detecting pressure of a fluid or the like contacting with a diaphragm portion of a semiconductor pressure sensing element of the device, in accordance with the electrical resistance change of the element due to a strain of the diaphragm portion caused by the pressure of the fluid.

For example, as shown in FIGS. 8 and 9, in a conventional semiconductor pressure detecting device, on a stem 1, there is joined a main body of the device, in which a pressure sensing element 2, inner leads 3, wires 5, and a pedestal 8 are molded together by a molding resin 6. Hereat a diaphragm portion 9 is formed in the central part of the pressure sensing element 2. The diaphragm portion 9 is not molded by the molding resin 6 so as to be exposed outward. Thus, when an outside pressure acts on the diaphragm portion 9, a strain is caused in the diaphragm portion 9 in accordance with the pressure so that the electrical resistance of the diaphragm portion 9 changes due to the strain. Then the pressure is detected according to the electrical resistance.

A conventional manufacturing method of the above-mentioned semiconductor pressure detecting device is nearly as follows. As shown in FIG. 10, first the pressure sensing element 2 including the diaphragm portion 9 is disposed on the pedestal 8, then the assembly constructed of the pressure sensing element 2 and the pedestal 8 is disposed on the stem 1 having the inner leads 3. Hereat a ring-shaped silicone resin packing 13 has been previously printed (applied) on an outer surface of the pressure sensing element 2. The ring-shaped silicone resin packing 13 has a shape or a size which can cover the circumferential part of the diaphragm portion 9. The silicone resin packing 13 is provided to prevent the molding resin 6 in melting condition from flowing into the diaphragm portion 9 during molding, as will be described later.

Next the wires 5 are connected to the pressure sensing element 2 and the inner leads 3. Then a molding die 7 having a contact portion 7a is disposed on the stem 1 so as to cover the pressure sensing element 2, the inner leads 3, the wires 5, and the pedestal 8. In this condition, the lower surface of the contact portion 7a of the molding die 7 contacts with the ring-shaped silicone resin packing 13. The contact portion 7a and the diaphragm portion 9 of the pressure sensing element 2 interact with each other via the silicone resin packing 13.

Next the molding resin 6 in melting condition is injected into a cavity 16 formed between the molding die 7 and the assembly including the stem 1, pressure sensing element 2, pedestal 8 etc.. Hereat the molding resin 6 in melting condition does not flow into the diaphragm portion 9 since the silicone resin packing 13 is interposed between the contact portion 7a of the molding die 7 and the pressure sensing element 2. Thus after the molding resin 6 in the cavity 16 is cooled so as to be solidified, the molding die 7 is removed so that the semiconductor pressure detecting device shown in FIGS. 8 and 9 is obtained.

However in the above-mentioned conventional manufacturing method, the following problems exist. In general, pressure sensing element 2 is produced by dividing a wafer by means of a cutting machine or the like while the silicone resin packings 13 are printed at every wafer. In other words, the silicone resin packings 13 are printed in a lump against the wafer which has not yet been divided into a plurality of pressure sensing elements 2. Therefore, in each of the pressure sensing elements 2 produced from the wafer, it is probable that a silicone resin packing 13 is not located at its normal position so that a position gap is caused between the silicone resin packing 13 and the contact portion 7a of the molding die 7 during molding. Also, when the pressure sensing element 2 is bonded with the pedestal 8 by the die bonding process, it is probable that a position gap occurs between both of them so that a position gap occurs between the silicone resin packing 13 and the contact portion 7a of the molding die 7. Thus, when the silicone resin packing 13 slips off from its normal position and the contact portion 7a is not in contact with the silicone resin packing 13, the molding resin 6 in melting condition flows into the diaphragm portion 9 during molding. In this case, a part of the molding resin 6 adheres to the outer surface of the diaphragm portion 9 so that the accuracy of pressure detecting is reduced.

Further, during printing of the silicone resin packing 13, it is probable that the silicone resin flows into a bonding pad of the pressure sensing element 2 due to the position slip of the wafer or drips of silicone resin so that the bonding strength between the wires 5 and the pressure sensing element 2 is reduced.

SUMMARY OF THE INVENTION

The present invention has been developed to solve the above-mentioned conventional problems, and has an object of providing a semiconductor pressure detecting device and a manufacturing method of the device which effectively prevents adhesion of the molding resin to the diaphragm portion of the pressure sensing element. Further, the present invention provides a semiconductor pressure detecting device and a manufacturing method of the device which improves the bonding strength between the wires and the pressure sensing element.

Thus, according to the first aspect of the present invention, which is developed to achieve the above-mentioned objects, there is provided a semiconductor pressure detecting device wherein a semiconductor pressure sensing element including a diaphragm portion, a pedestal for supporting the pressure sensing element, and at least one wire connected to the pressure sensing element are molded by a molding resin so as not to mold the diaphragm portion, characterized in that a silicone resin layer is adhered (applied or disposed) on a whole outer surface of the pressure sensing element.

In this device according to the first aspect of the present invention, since the silicone resin layer is adhered (applied or disposed) to the whole outer surface of the pressure sensing element, the contact portion of the molding die contacts with the silicone resin layer tightly so as to form a seal such that the molding resin in melting condition does not flow into a space (cavity) corresponding to the diaphragm portion of the pressure sensing element during molding. Thus the molding resin does not adhere to a part of the silicone resin layer corresponding to the diaphragm portion of the pressure sensing element so that the accuracy of the semiconductor pressure detecting device is improved. Further, the silicone resin does not flow into a bonding pad of the pressure sensing element before the bonding process so that the bonding strength between the wire and the pressure sensing element is improved.

According to the second aspect of the present invention, there is provided a semiconductor pressure detecting device wherein a semiconductor pressure sensing element including a diaphragm portion, a pedestal for supporting the pressure sensing element, and at least one wire connected to the pressure sensing element are molded by a molding resin so as not to mold the diaphragm portion, characterized in that a silicone resin layer is adhered (applied or disposed) on an outer surface of the diaphragm portion.

In this device according to the second aspect of the present invention, since the silicone resin layer is adhered (applied or disposed) to the outer surface of the diaphragm portion, the contact portion of the molding die contacts with the silicone resin layer tightly so as to form a seal such that the molding resin in melting condition does not flow into a space (cavity) corresponding to the diaphragm portion of the pressure sensing element during molding. Thus the molding resin does not adhere to the silicone resin layer corresponding to the diaphragm portion of the pressure sensing element so that the accuracy of the semiconductor pressure detecting device is improved. Also the consumption quantity of the silicone resin is reduced so that the manufacturing cost of the device is reduced as compared with the case of the first aspect of the present invention. Further, the silicone resin does not flow into a bonding pad of the pressure sensing element before the bonding process so that the bonding strength between the wire and the pressure sensing element is improved.

According to the third aspect of the present invention, there is provided a semiconductor pressure detecting device in accordance with the second aspect of the present invention, wherein a coating layer is applied on an outer surface of the pressure sensing element except the diaphragm portion.

In this device according to the third aspect of the present invention, fundamentally, the same operations and effects as in the second aspect of the present invention are achieved. Further, since the silicone resin does not flow out of the diaphragm portion during application onto the diaphragm portion due to the coating layer, less silicone resin is used so that the manufacturing cost of the semiconductor pressure detecting device is reduced.

According to the fourth aspect of the present invention, there is provided a semiconductor pressure detecting device in accordance with the third aspect of the present invention, wherein the coating layer is made of glass.

In this device according to the fourth aspect of the present invention, fundamentally, the same operations and effects as in the third aspect of the present invention are achieved. Further, since the coating layer is made of glass which is one of generally economical (inexpensive) and easily usable (workable) coating materials, the manufacturing cost of the semiconductor pressure detecting device is further reduced.

According to the fifth aspect of the present invention, there is provided a manufacturing method of a semiconductor pressure detecting device comprising the steps of, disposing a semiconductor pressure sensing element including a diaphragm portion on a pedestal, connecting at least one wire to the pressure sensing element, adhering (applying or disposing) a silicone resin layer onto a whole outer surface of the pressure sensing element to which the wire is connected, and molding the pressure sensing element, the wire, and the pedestal together with a molding resin by using a molding die having a contact portion which contacts with a part of the silicone resin layer corresponding to the diaphragm portion of the pressure sensing element during molding, so as not to mold the part of the silicone resin layer.

In this method according to the fifth aspect of the present invention, since the silicone resin layer is adhered (applied or disposed) to the whole outer surface of the pressure sensing element before the molding step, and then the contact portion of the molding die contacts with the silicone resin layer tightly in the molding step, the molding resin in melting condition does not flow into a space (cavity) corresponding to the diaphragm portion of the pressure sensing element during molding. Thus the molding resin does not adhere to a part of the silicone resin layer corresponding to the diaphragm portion of the pressure sensing element so that the accuracy of the semiconductor pressure detecting device is improved. Further, the silicone resin does not flow into a bonding pad of the pressure sensing element before the bonding process so that the bonding strength between the wire and the pressure sensing element is improved.

According to the sixth aspect of the present invention, there is provided a manufacturing method of a semiconductor pressure detecting device comprising the steps of, disposing a semiconductor pressure sensing element including a diaphragm portion on a pedestal, connecting at least one wire to the pressure sensing element, adhering (applying or disposing) a silicone resin layer onto an outer surface of the diaphragm portion, and molding the pressure sensing element, the wire, and the pedestal together with a molding resin by using a molding die having a contact portion which contacts with the silicone resin layer during molding, so as not to mold the silicone resin layer.

In this method according to the sixth aspect of the present invention, since the silicone resin layer is adhered (applied or disposed) to the outer surface of the diaphragm portion before the molding step, and the contact portion of the molding die contacts with the silicone resin layer tightly in the molding step, the molding resin in melting condition does not flow into a space (cavity) corresponding to the diaphragm portion of the pressure sensing element during molding. Thus the molding resin does not adhere to the silicone resin layer corresponding to the diaphragm portion of the pressure sensing element so that the accuracy of the semiconductor pressure detecting device is improved. Also less silicone resin is used so that the manufacturing cost of the semiconductor pressure detecting device is reduced as compared with the case of the fifth aspect of the present invention. Further, the silicone resin does not flow into a bonding pad of the pressure sensing element before the bonding process so that the bonding strength between the wire and the pressure sensing element is improved.

According to the seventh aspect of the present invention, there is provided a manufacturing method of a semiconductor pressure detecting device in accordance with the sixth aspect of the present invention, wherein the method further comprises the step of applying a coating layer onto the pressure sensing element, except the diaphragm portion, while processing a wafer from which the pressure sensing element is produced before the pressure sensing element disposing step.

In this method according to the seventh aspect of the present invention, fundamentally, the same operations and effects as in the sixth aspect of the present invention are achieved. Further, since the silicone resin does not flow out of the diaphragm portion due to the coating layer when the silicone resin is applied onto the diaphragm portion, less silicone resin is used so that the manufacturing cost of the semiconductor pressure detecting device is reduced.

According to the eighth aspect of the present invention, there is provided a manufacturing method of a semiconductor pressure detecting device in accordance with the seventh aspect of the present invention, wherein a glass coating layer is applied as the coating layer in the coating layer applying step.

In this method according to the eighth aspect of the present invention, fundamentally, the same operations and effects as in the seventh aspect of the present invention are achieved. Further, since the coating layer is made of glass which is one of generally economical and easily usable coating materials, the manufacturing cost of the semiconductor pressure detecting device is further reduced.

According to the ninth aspect of the present invention, there is provided a manufacturing method of a semiconductor pressure detective device in accordance with the sixth aspect of the present invention, characterized in that a plurality of the pressure sensing elements are produced from one wafer before the pressure sensing element disposing step, and the silicone resin layer adhering step is performed before the pressure sensing element disposing step, the silicone resin layers being adhered onto the pressure sensing elements at every wafer in the silicone resin layer adhering step.

In this method according to the ninth aspect of the present invention, fundamentally, the same operations and effects as in the sixth aspect of the present invention are achieved. Further, since a plurality of the pressure sensing elements are produced from one wafer, and then the silicone resin layers are adhered onto the pressure sensing elements in a lump at every wafer in the adhering step, the productivity of the semiconductor pressure detecting device is improved. Therefore the manufacturing cost of the semiconductor pressure detecting device is reduced.

According to the tenth aspect of the present invention, there is provided a manufacturing method of a semiconductor pressure detecting device comprising the steps of, disposing a semiconductor pressure sensing element including a diaphragm portion on a pedestal, connecting at least one wire to the pressure sensing element, and molding the pressure sensing element, the wire, and the pedestal together with a molding resin by using a molding die having an interaction portion which interacts with the diaphragm portion during molding and an elastic body which presses the diaphragm portion during molding on a surface of the interaction portion, so as not to mold the diaphragm portion.

In this method according to the tenth aspect of the present invention, since the elastic body exists between the interaction portion of the molding die and the pressure sensing element during molding, the seal between the portion and the element is improved so that the molding resin in melting condition does not flow into a space (cavity) corresponding to the diaphragm portion of the pressure sensing element during molding. Thus the molding resin does not adhere to the diaphragm portion of the pressure sensing element so that the accuracy of the semiconductor pressure detecting device is improved. Further, since silicone resin is potted onto the pressure sensing element, the bonding strength between the wire and the pressure sensing element is improved.

According to the eleventh aspect of the present invention, there is provided a manufacturing method of a semiconductor pressure detecting device comprising the steps of, disposing a pressure sensing element made of semiconductor and including a diaphragm portion on a pedestal, connecting at least one wire to the pressure sensing element, and molding the pressure sensing element, the wire, and the pedestal together with a molding resin by using a molding die having an interaction portion which interacts with the diaphragm portion during molding and an O-ring which presses a circumferential part of the diaphragm portion during molding on a surface of the interaction portion, so as not to mold the diaphragm portion.

In this method according to the eleventh aspect of the present invention, since the O-ring exists between the interaction portion of the molding die and the pressure sensing element during molding, the seal between the portion and the element is improved so that the molding resin in melting condition does not flow into a space (cavity) corresponding to the diaphragm portion of the pressure sensing element during molding. Thus the molding resin does not adhere to the diaphragm portion of the pressure sensing element so that the accuracy of the semiconductor pressure detecting device is improved. Further, since silicone resin is potted onto the pressure sensing element, the bonding strength between the wire and the pressure sensing element is improved.

According to the twelfth aspect of the present invention, there is provided a manufacturing method of a semiconductor pressure detecting device in accordance with the tenth aspect of the present invention, wherein the elastic body is made of rubber.

In this method according to the twelfth aspect of the present invention, fundamentally, the same operations and effects as in the tenth aspect of the present invention are achieved. Further, the elastic body is made of rubber which is one of economical and easily usable elastic materials so that the manufacturing cost of the semiconductor pressure detecting device is further reduced.

According to the thirteenth aspect of the present invention, there is provided a manufacturing method of a semiconductor pressure detecting device in accordance with the eleventh aspect of the present invention, wherein the O-ring is made of rubber.

In this method according to the thirteenth aspect of the present invention, fundamentally, the same operations and effects as in the eleventh aspect of the present invention are achieved. Further, the O-ring is made of rubber which is an economical and easily workable elastic material. Thus the manufacturing cost of the semiconductor pressure detecting device is further reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 8:
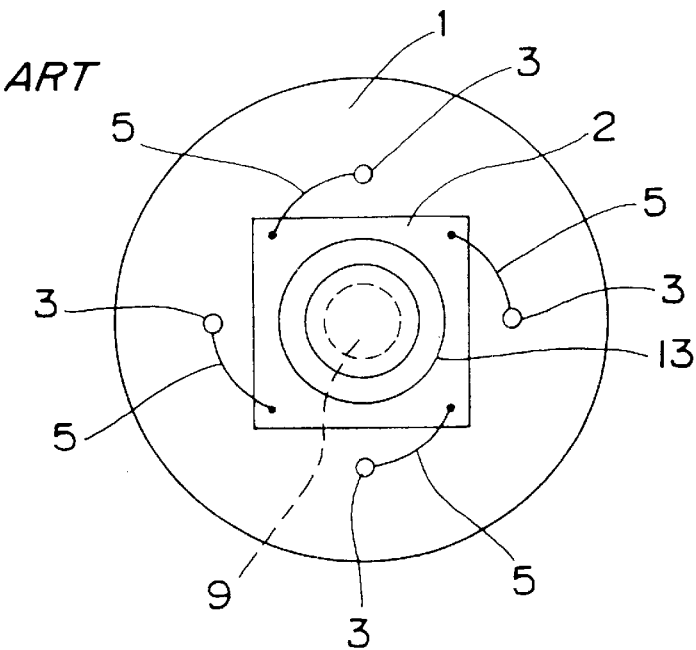
FIG. 8 is a plane view (top view) of a conventional semiconductor pressure detecting device.
Figure 9:
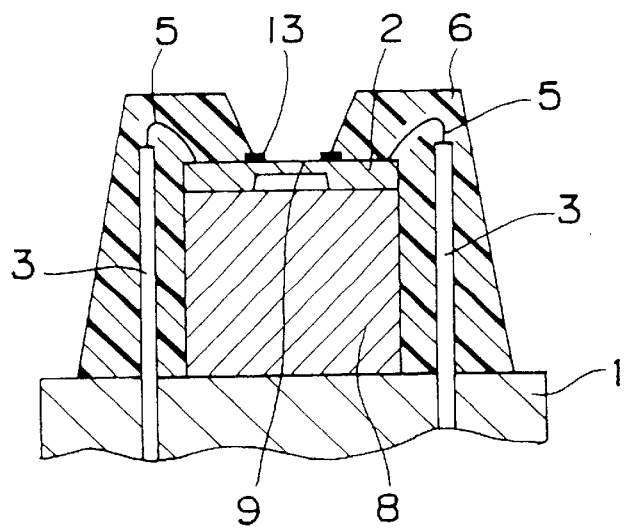
FIG. 9 is a vertical sectional view of the conventional semiconductor pressure detecting device shown in FIG. 8.
Figure 10:
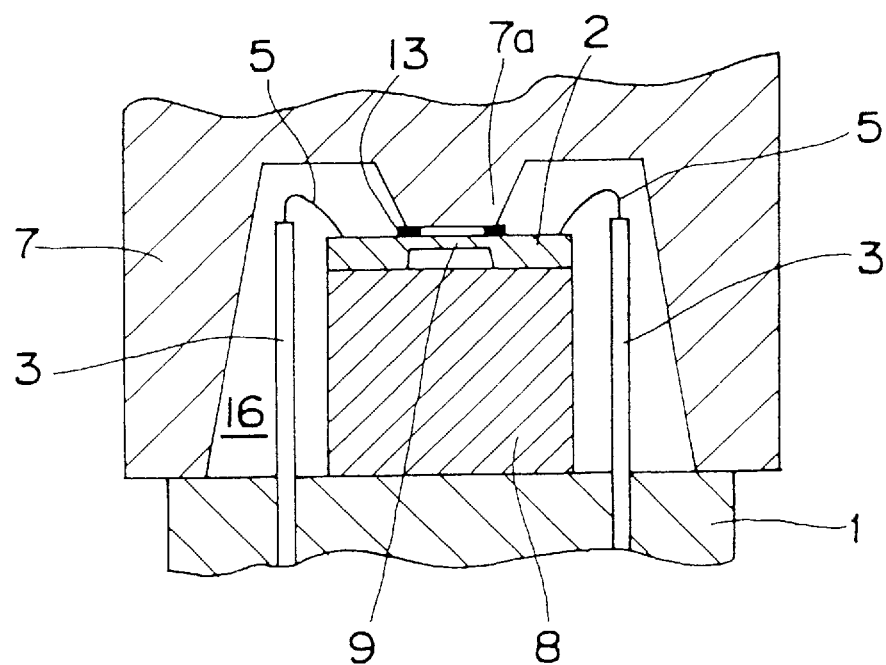
FIG. 10 is a vertical sectional view of the conventional semiconductor pressure detecting device with a molding die on a way of manufacturing step thereof.

Hereinafter, several preferred embodiments of the present invention will be described with reference to the accompanying drawings. However the duplicate description for the conventional semiconductor pressure detecting device or its manufacturing method as shown in FIGS. 8 to 10 discussed previously is omitted, and differences with the conventional art will mainly be described. Thus in FIGS. 1A to 7, which show the embodiments of the present invention, the duplicate members for the conventional pressure detecting device shown in FIGS. 8 to 10 have the same reference numerals as that of the conventional semiconductor pressure detecting device. Further, in the manufacturing methods of the semiconductor pressure detecting devices according to the embodiments, steps which are not particularly described are nearly the same as the conventional manufacturing method described in the "Description of the Prior Art" in the present specification.

<The First Embodiment>

Figure 1A:
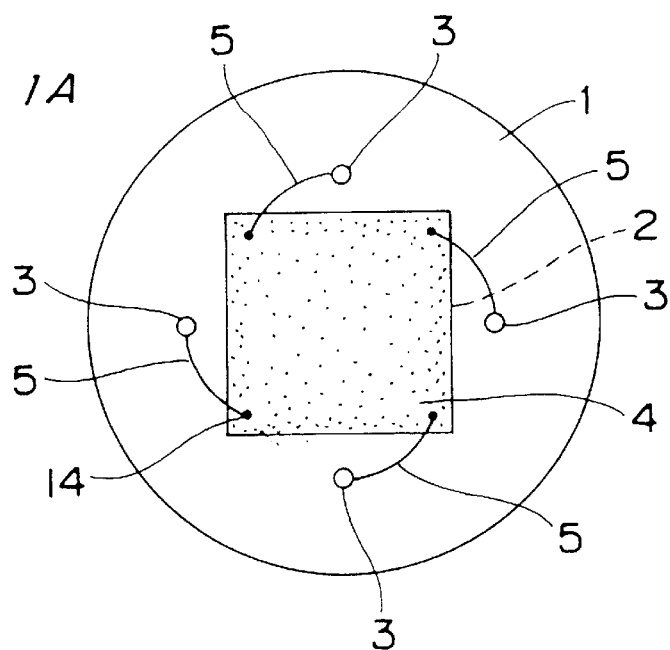
FIGS. 1A and 1B are a plane view (top view) and a vertical sectional view of a semiconductor pressure detecting device according to the first embodiment of the present invention respectively.
Figure 1B:
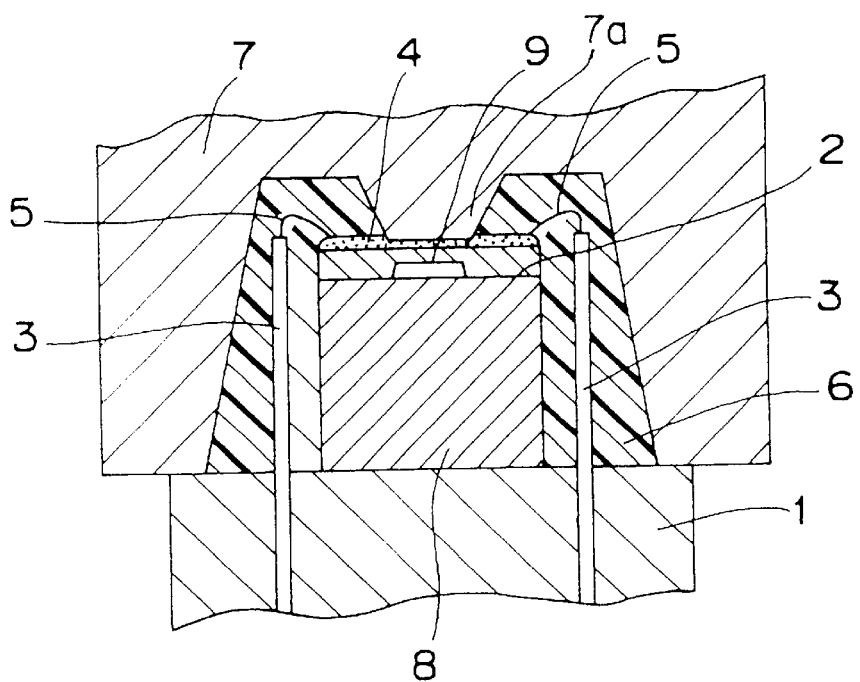

As shown in FIGS. 1A and 1B, in a manufacturing method of a semiconductor pressure detecting device according to the first embodiment, first a pressure sensing element 2 with a diaphragm portion 9 is joined to a pedestal 8. Next the pedestal 8 with the pressure sensing element 2 is bonded to a stem 1 with inner leads 3, each of wires 5 is bonded to a corresponding one of the inner leads 3 and the pressure sensing element 2, then a silicone resin layer 4 is adhered (applied or disposed) to the whole outer surface of the pressure sensing element 2 by a potting process. It is preferable that the silicone resin layer 4 is formed by an elastic silicone resin material so as to prevent affecting the pressure detecting and to improve the accuracy of the semiconductor pressure detecting device. During molding, which is the last step of the manufacturing process, the silicone resin layer 4 on the diaphragm portion 9 is pressed by a contact portion 7a of a molding die 7 so that an influx of a molding resin 6 into the space (cavity) corresponding to the diaphragm portion 9 is prevented. Therefore the molding resin 6 does not adhere to a part of the silicone resin layer 4 corresponding to the diaphragm portion 9 of the pressure sensing element 2.

In this way, the accuracy of the semiconductor pressure detecting device is improved. Further, since the silicone resin layer 4 is adhered to the pressure sensing element 2 by a potting process after wire bonding, in other words, since the silicone resin does not flow into bonding pads 14 of the pressure sensing element 2 before wire bonding, the bonding strength (connection strength) between each of the wires 5 and the pressure sensing element 2 is improved as compared with the conventional case. Thus, according to the first embodiment, the influx of the molding resin 6 into the space corresponding to the diaphragm portion 9 is prevented so that the pressure detecting may be performed with high accuracy and the reduction of the bonding strength may be prevented effectively.

<The Second Embodiment>

Figure 2:
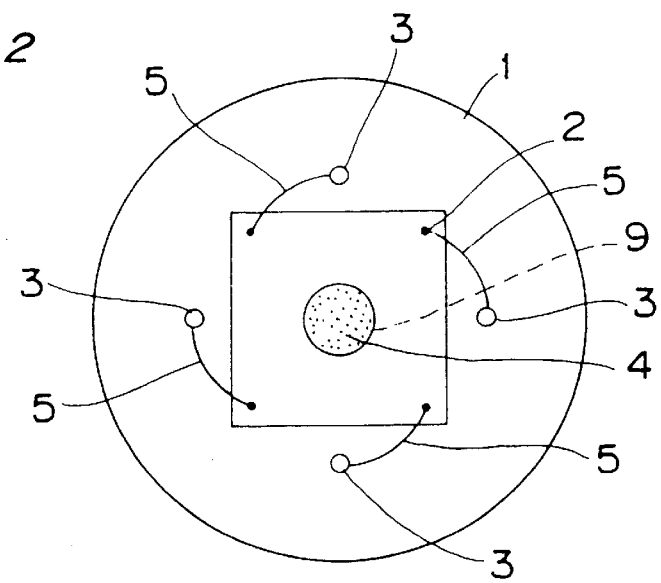
FIG. 2 is a plane view (top view) of a semiconductor pressure detecting device according to the second embodiment of the present invention.

As shown in FIG. 2, according to the second embodiment, the silicone resin layer 4 is adhered only to the outer surface of the diaphragm portion 9 of the pressure sensing element 2. According to the second embodiment, fundamentally, the same operations and effects as in the first embodiment are achieved. Further, since the silicone resin layer 4 is not adhered (potted) to the outside of the diaphragm portion 9, less silicone resin is used so that the manufacturing cost of the semiconductor pressure detecting device is reduced.

<The Third Embodiment>

Figure 3:
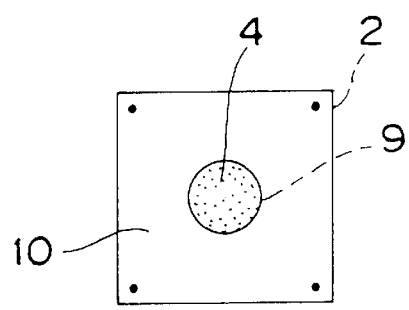
FIG. 3 is a plane view (top view) of a semiconductor pressure detecting device according to the third embodiment of the present invention.
Figure 4:
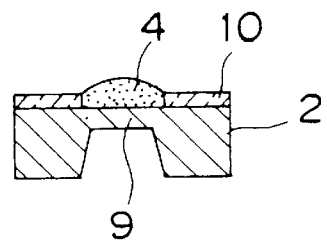
FIG. 4 is a vertical sectional view of the semiconductor pressure detecting device according to the third embodiment of the present invention.

As shown in FIGS. 3 and 4, according to the third embodiment, a coating layer 10 made of glass or the like is applied on the outer surface of the pressure sensing element 2 except the diaphragm portion 9 so that a step-shaped undulation is formed on the surface of the pressure sensing element 2, so as to prevent an efflux of the silicone resin layer 4 out of the part corresponding to the diaphragm portion 9 of the pressure sensing element 2 while processing a wafer.

According to the third embodiment, since the silicone resin layer 4 does not flow out of the part corresponding to the diaphragm portion 9, the wire bonding step can be performed either before or after the silicone resin potting step so that flexibility of the manufacturing step arrangement is increased. Thus, according to the third embodiment, an influx of the molding resin 6 into the part corresponding to the diaphragm portion 9 is prevented. Also the reduction of the bonding strength between the wires 5 and pressure sensing element 2 is prevented.

<The Fourth Embodiment>

Figure 5:
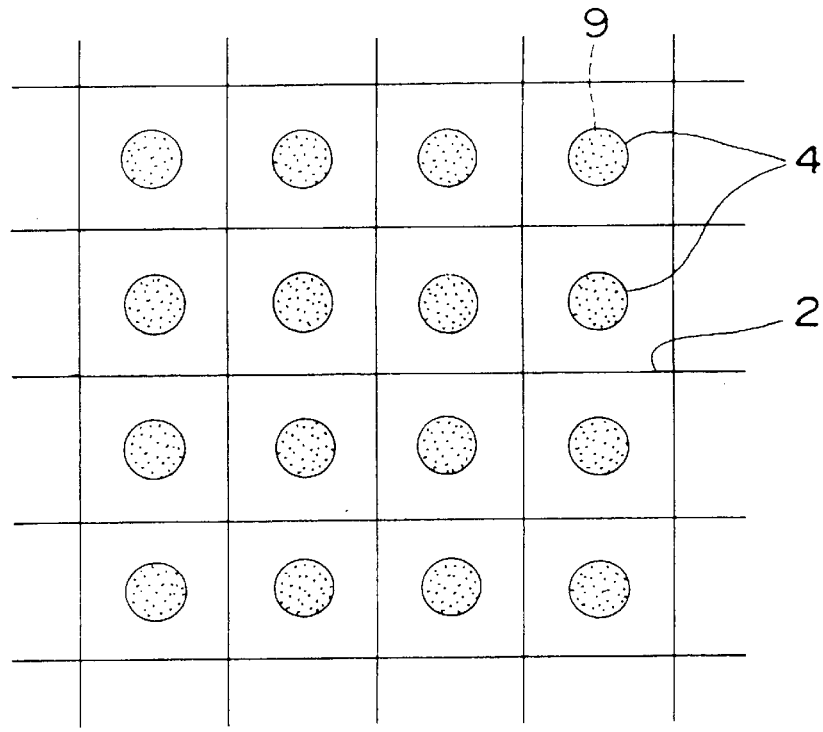
FIG. 5 is a plane view of a wafer for pressure sensing elements according to the fourth embodiment of the present invention.

As shown in FIG. 5, according to the fourth embodiment, a plurality of the pressure sensing elements 2 are produced from one wafer before the pressure sensing element disposing step. Then, the silicone resin layer adhering step is performed before the pressure sensing element disposing step, and the silicone resin layers 4 are adhered onto the diaphragm portions 9 of the pressure sensing elements 2 at every wafer in the silicone resin layer adhering step. According to the fourth embodiment, since a plurality of the pressure sensing elements 2 are produced from one wafer, and then the silicone resin layers 2 are adhered onto the pressure sensing elements 2 in a lump at every wafer in the adhering step, the processing time is shortened as compared to the manufacturing method of the semiconductor pressure detecting device according to the first to third embodiments. Therefore, the productivity of the semiconductor pressure detecting device is improved and the manufacturing cost of the semiconductor pressure detecting device is reduced.

<The Fifth Embodiment>

Figure 6:
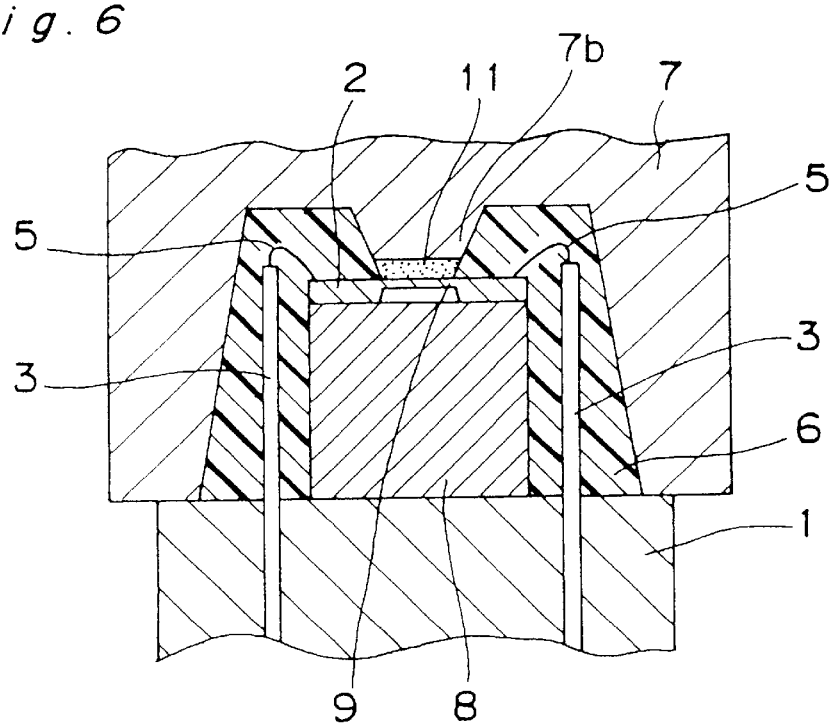
FIG. 6 is a vertical sectional view of the semiconductor pressure detecting device according to the fifth embodiment of the present invention.

As shown in FIG. 6, according to the fifth embodiment, on an interaction portion 7b of the molding die 7 which is used during molding, specifically on a part of the molding die 7 interacting with the diaphragm portion 9 of the pressure sensing element 2 during molding, an elastic body 11 made of rubber is provided so that the diaphragm portion 9 is pressed by the elastic body 11 during molding. Thus an influx of the molding resin 6 into the space corresponding to the diaphragm portion 9 is prevented effectively by the elastic body 11 during molding. Further it is not required to apply a silicone resin onto the surface of the pressure sensing element 2 by a potting process.

In this way, according to the fifth embodiment, the influx of the molding resin 6 into the diaphragm portion 9 is prevented. Thus the molding resin 6 does not adhere to the diaphragm portion 9 of the pressure sensing element 2 so that the accuracy of the semiconductor pressure detecting device is improved. Further, since silicone resin is not potted onto the pressure sensing element 2, the reduction of the bonding strength between the wires 5 and the pressure sensing element 2, due to an influx of the silicone resin into the bonding pad 14, is prevented. Moreover, since the number of steps is reduced, the manufacturing cost of the semiconductor pressure detecting device is reduced.

<The Sixth Embodiment>

Figure 7:
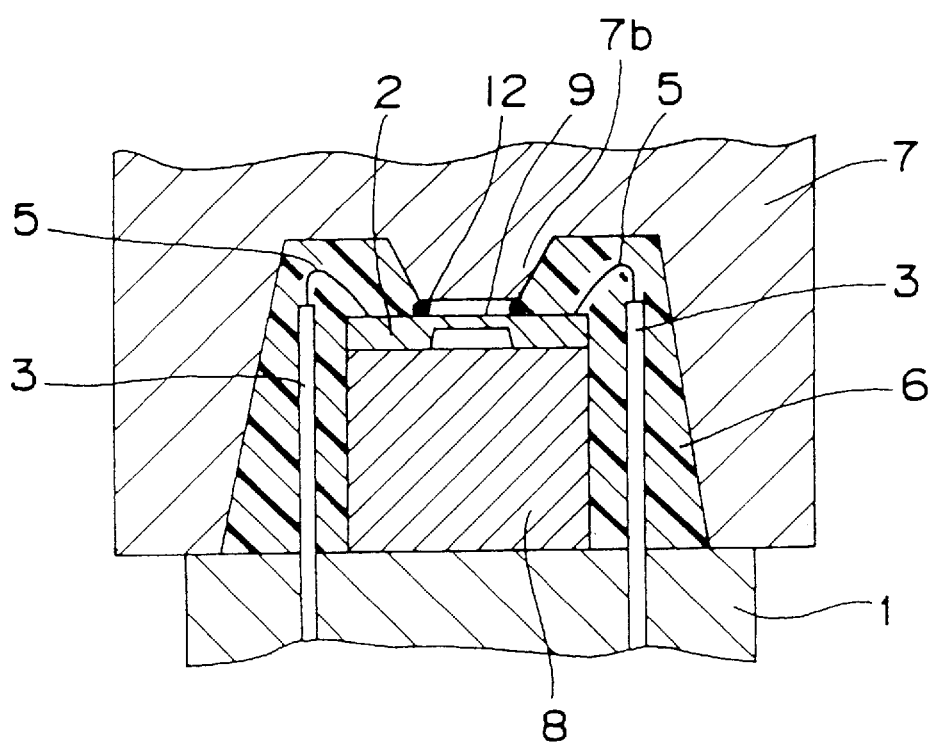
FIG. 7 is a vertical sectional view of the semiconductor pressure detecting device according to the sixth embodiment of the present invention.

As shown in FIG. 7, according to the sixth embodiment, on a part of the interaction portion 7b of the molding die 7, the part interacting to the circumferential part of the diaphragm portion 9, there is provided an elastic O-ring 12 made of rubber so that the diaphragm portion 9 is pressed by the O-ring 12 during molding. Thus an influx of the molding resin 6 into the space corresponding to the diaphragm portion 9 is prevented effectively by the O-ring 12 during molding. Further, since the O-ring 12 does not contact to the main body of the diaphragm portion 9, a contact defect of the diaphragm portion 9 is prevented so that the pressure detecting accuracy is improved.

In this way, according to the sixth embodiment, the influx of the molding resin 6 into the diaphragm portion 9 is prevented, and also the contact defect of the diaphragm 9 is prevented. Thus the accuracy of the semiconductor pressure detecting device is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of a semiconductor pressure detecting device comprising the steps of:

disposing a semiconductor pressure sensing element including a diaphragm portion onto a pedestal;

connecting at least one wire to said semiconductor pressure sensing element; adhering a silicone resin layer onto a whole outer surface of said semiconductor pressure sensing element to which said wire is connected; and molding said semiconductor pressure sensing element, said wire and said pedestal together with a molding resin, by using a molding die having a contact portion which contacts with such a part of said silicone resin layer as corresponds to said diaphragm portion of said semiconductor pressure sensing element so as to prevent said molding resin from contacting said part of said silicone resin layer during molding of said semiconductor pressure sensing element, said wire and said pedestal.

2. The manufacturing method of the semiconductor pressure detecting device recited in claim 1, wherein said silicone resin layer is elastic.

3. A manufacturing method of a semiconductor pressure detecting device comprising the steps of:

disposing a semiconductor pressure sensing element including a diaphragm portion onto a pedestal;

connecting at least one wire to said semiconductor pressure sensing element;

adhering a silicone resin layer onto an outer surface of said diaphragm portion; and molding said semiconductor pressure sensing element, said wire and said pedestal together with a molding resin, by using a molding die having a contact portion which contacts with said silicone resin layer so as to prevent said molding resin from contacting said silicone resin layer during molding of said semiconductor pressure sensing element, said wire and said pedestal.

4. The manufacturing method of the semiconductor pressure detecting device recited in claim 3, further comprising the step of applying a coating layer onto said semiconductor pressure sensing element excluding said diaphragm portion during processing a wafer from which said semiconductor pressure sensing element is produced, before said semiconductor pressure sensing element disposing step.

5. The manufacturing method of the semiconductor pressure detecting device recited in claim 4, wherein a glass coating layer is applied as said coating layer in said coating layer applying step.

6. The manufacturing method of the semiconductor pressure detecting device recited in claim 3, wherein a plurality of said semiconductor pressure sensing elements are produced from one wafer before said semiconductor pressure sensing element disposing step, and said silicone resin layer adhering step is performed before said semiconductor pressure sensing element disposing step, said silicone resin layers being adhered onto said semiconductor pressure sensing elements at every wafer in said silicone resin layer adhering step.

7. The manufacturing method of the semiconductor pressure detecting device recited in claim 3, wherein said silicone resin layer is elastic.

8. A manufacturing method of a semiconductor pressure detecting device comprising the steps of:

disposing a semiconductor pressure sensing element including a diaphragm portion onto a pedestal;

connecting at least one wire to said semiconductor pressure sensing element; and molding said semiconductor pressure sensing element, said wire and said pedestal together with a molding resin, by using a molding die having an interaction portion which interacts with said diaphragm portion and an elastic body which presses said diaphragm portion onto a surface of said interaction portion so as to prevent said molding resin from contacting said diaphragm portion during molding of said semiconductor pressure sensing element, said wire and said pedestal.

9. The manufacturing method of the semiconductor pressure detecting device recited in claim 8, wherein said elastic body is made of rubber.

10. A manufacturing method of a semiconductor pressure detecting device comprising the steps of:

disposing a semiconductor pressure sensing element including a diaphragm portion onto a pedestal;

connecting at least one wire to said semiconductor pressure sensing element; and molding said semiconductor pressure sensing element, said wire and said pedestal together with a molding resin, by using a molding die having an interaction portion which interacts with said diaphragm portion and an O-ring which presses a circumferential part of said diaphragm portion onto a surface of said interaction portion so as to prevent said molding resin from contacting said diaphragm portion during molding of said semiconductor pressure sensing element, said wire and said pedestal.

11. The manufacturing method of the semiconductor pressure detecting device recited in claim 10, wherein said O-ring is made of rubber.

* * * * *

UNITED STATES PATENT AND TRADEMARK OFFICE
CERTIFICATE OF CORRECTION

PATENT NO. : 5,811,321
DATED     : September 22, 1998
INVENTOR(S) : Yasuo YAMAGUCHI It is certified that error appears in the above-identified patent and that said Letters Patent is hereby corrected as shown below:

Title page, item [62] change "Oct. 19, 1995" to read--Oct. 16, 1995--.

Signed and Sealed this

Thirteenth Day of April, 1999

Attest:

Q. TODD DICKINSON

*Attesting Officer*   *Acting Commissioner of Patents and Trademarks*